United States Patent
Herraiz et al.

(10) Patent No.: US 8,878,547 B2
(45) Date of Patent: Nov. 4, 2014

(54) INSULATION RESISTANCE MONITORING FOR VEHICLES WITH HIGH-VOLTAGE POWER NET

(75) Inventors: Marc Deumal Herraiz, Valls (ES); Albert Trenchs Magaña, Valls (ES); Antoni Ferré Fàbregas, Valls (ES)

(73) Assignee: Lear Corporation, Southfield, MI (US)

( * ) Notice: Subject to any disclaimer, the term of this patent is extended or adjusted under 35 U.S.C. 154(b) by 298 days.

(21) Appl. No.: 13/286,174

(22) Filed: Oct. 31, 2011

(65) Prior Publication Data

US 2013/0106437 A1    May 2, 2013

(51) Int. Cl.
G01R 27/28 (2006.01)
G01R 27/18 (2006.01)
G01R 31/11 (2006.01)

(52) U.S. Cl.
CPC ............... *G01R 27/18* (2013.01); *G01R 31/11* (2013.01)
USPC ........... 324/615; 324/503; 324/509; 324/511; 324/520; 324/522; 701/22

(58) Field of Classification Search
USPC ......... 324/503, 520, 522, 509–511, 613, 615; 375/208, 350; 701/22
See application file for complete search history.

(56) References Cited

U.S. PATENT DOCUMENTS

| | | | |
|---|---|---|---|
| 5,561,380 A | 10/1996 | Sway-Tin et al. | |
| 6,856,137 B2 | 2/2005 | Roden et al. | |
| 6,919,726 B2 * | 7/2005 | Yudahira | 324/522 |
| 6,992,490 B2 | 1/2006 | Nomoto et al. | |
| 7,075,311 B1 | 7/2006 | Oshiro et al. | |
| 7,295,509 B2 * | 11/2007 | Laroia et al. | 370/208 |
| 7,554,333 B2 * | 6/2009 | Morita | 324/509 |
| 7,920,662 B2 * | 4/2011 | Zhu et al. | 375/350 |
| 2007/0008666 A1 | 1/2007 | Morita et al. | |
| 2010/0244760 A1 | 9/2010 | Anwar et al. | |

FOREIGN PATENT DOCUMENTS

JP    2004104923    *  9/2002

OTHER PUBLICATIONS

English machine translation of JP 2004104923, author Katsuta et al. is attached.*

* cited by examiner

*Primary Examiner* — Arleen M Vazquez
*Assistant Examiner* — Neel Shah
(74) *Attorney, Agent, or Firm* — Brooks Kushman P.C.

(57) ABSTRACT

A monitor for monitoring isolation resistance, impedance, or other isolation reflective conditions between vehicle systems as contemplated. The monitor may be useful in assessing insulation resistance between a high-voltage power net and a low-voltage power net. The monitor may be configured to assess a sufficiency of the insulation resistance based on a frequency response of the high-voltage power net.

12 Claims, 4 Drawing Sheets

INSULATION RESISTANCE MONITORING FOR VEHICLES WITH HIGH-VOLTAGE POWER NET

TECHNICAL FIELD

The present invention relates to monitoring systems for use within the vehicle, such as monitoring systems configured to monitor insulation resistance between a high-voltage power net and a vehicle chassis.

BACKGROUND

Electric vehicles (EV), hybrid-electric vehicles (HEVs), and other vehicles may include a high-voltage power net and a low-voltage power net. The low-voltage power net may be grounded to the vehicle chassis whereas high-voltage power net may be configured with a floating ground, i.e., not grounded to the vehicle chassis. Because the high-voltage power net is not grounded to the same ground as the vehicle chassis, a potential exists for electrical discharge between the high-voltage power net and the low-voltage power net. In some cases where the high-voltage power net is sufficiently great, it may be desirable to provide a certain amount of insulation between the high-voltage power net and the low-voltage power net, which may be quantified as insulation resistance.

The desired amount of insulation resistance may vary depending on the magnitude of the voltage being carried over the high-voltage power net and/or a voltage differential between the high-voltage power net in the low-voltage power net. The amount of insulation resistance may be related to an amount of impedance between the high-voltage power net and vehicle ground, i.e. the vehicle chassis. The impedance between the high-voltage power net and the vehicle ground may be assessed prior to activation/start-up of the high-voltage power net, i.e., prior to a high-voltage battery or other high-voltage energy source discharging. This pre-activation impedance determination may be beneficial in assessing insulation prior to operation of the high-voltage power net, however, it fails to sufficiently assess insulation concerns that may arise after activation of the high-voltage power net. Accordingly, a need exists to monitor resistance after activation of the high-voltage power net.

SUMMARY

One non-limiting aspect of the present invention relates to a method of monitoring insulation resistance between a high-voltage power net and a low-voltage power net, the high-voltage power net and the low-voltage power net being included within a vehicle, the low-voltage power net being grounded to a first ground and the high-voltage power net being grounded to a second ground, the second ground floating relative to the first ground. The method comprising: measuring a first frequency response of the high-voltage power net while the high-voltage power net is active; and comparing the first frequency response to a second frequency response to determine whether a desired insulation resistance is provided between the high-voltage power net and the low-voltage power net.

The method may include applying a test signal to the high-voltage power net, the first frequency response being a response of the high-voltage power net to the test signal.

The method may include applying the test signal to include at least two subcarriers.

The may include applying the test signal such that each of the at least two subcarriers are orthogonal.

The method may include generating the test signal initially as a digital signal, and thereafter, converting the test signal to an analog signal such that the test signal is applied to the high-voltage power net as the analog signal.

The method may include converting the first frequency response from an analog domain to a digital domain, and wherein the digital domain of the first frequency response is compared the second frequency response to determine whether the desired insulation resistance is provided.

The method may include compensating for a time delay between the first frequency response and the second frequency response by converting the digital domain of the first frequency response to a modified first frequency response such that the modified first frequency response is compared to the second frequency response to determine whether the desired insulation resistance is provided.

The method may include generating the modified first frequency response by copying an ending portion of the digital domain of the first response to proceed a beginning portion of the digital domain of the first response.

The method may include setting a length of the ending portion to approximately equal the time delay between the first frequency response and the second frequency response.

The method may include measuring the first frequency response while a high-voltage battery is one of charging and discharging over the high-voltage power net, the high-voltage power net being active when the battery is the one of charging and discharging.

The method may include determining the desired insulation resistance to be provided in the event the first frequency response differs from the second frequency response by no more than a first amount, else determining the desired insulation resistance to be absent.

The method may include the second ground being connected to a chassis of the vehicle.

One non-limiting aspect of the present invention relates to a method of monitoring insulation resistance between a high-voltage power net and a low-voltage power net, the high-voltage power net and the low-voltage power net being included within a vehicle. The method comprising: applying a test signal to the high-voltage power net; measuring a first frequency response of the high-voltage power net to the test signal; and comparing the first frequency response to a second frequency response to determine whether a desired insulation resistance is provided between the high-voltage power net and the low-voltage power net.

The method may include applying the test signal to include at least two subcarriers.

The method may include applying the test signal such that each of the at least two subcarriers are orthogonal.

The method may include comparing the first frequency response to the second frequency response includes adjusting the first frequency response to compensate for a time delay between the first frequency response the second frequency response.

The method may include adjusting the first frequency response includes moving an ending portion of the first frequency response to precede a beginning portion of the first frequency response, and thereafter, comparing the first frequency response to the second frequency response to determine whether the desired insulation resistance is provided.

One non-limiting aspect of the present invention relates to a circuit operable to assess insulation resistance of a high-voltage power net included within a vehicle. The circuit comprising: a controller operable to output a digital test signal; a digital-to-analog converter operable to convert the digital test signal to an analog test signal; a positive sensing impedance operable to output the analog test signal to a positive bus of the high-voltage power net; a negative sensing impedance operable to output the analog test signal to a negative bus of the high-voltage power net; a positive analog-to-digital converter operable to convert a positive analog response of the positive bus to the test signal for output as a positive digital response to the controller; a negative analog-to-digital converter operable to convert a negative analog response of the positive bus to the test signal for output as a negative digital response to the controller; wherein the controller determines a first frequency response of the high-voltage power net to the test signal based on at least one of the positive digital response and the negative digital response; and wherein the controller compares the first frequency response to a second frequency response to determine whether a desired insulation resistance is provided between the high-voltage power net and a chassis of the vehicle.

The circuit may include the controller generating the test signal to include at least two subcarriers.

The circuit may include the controller generating the test signal such that each of the at least two subcarriers are orthogonal.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
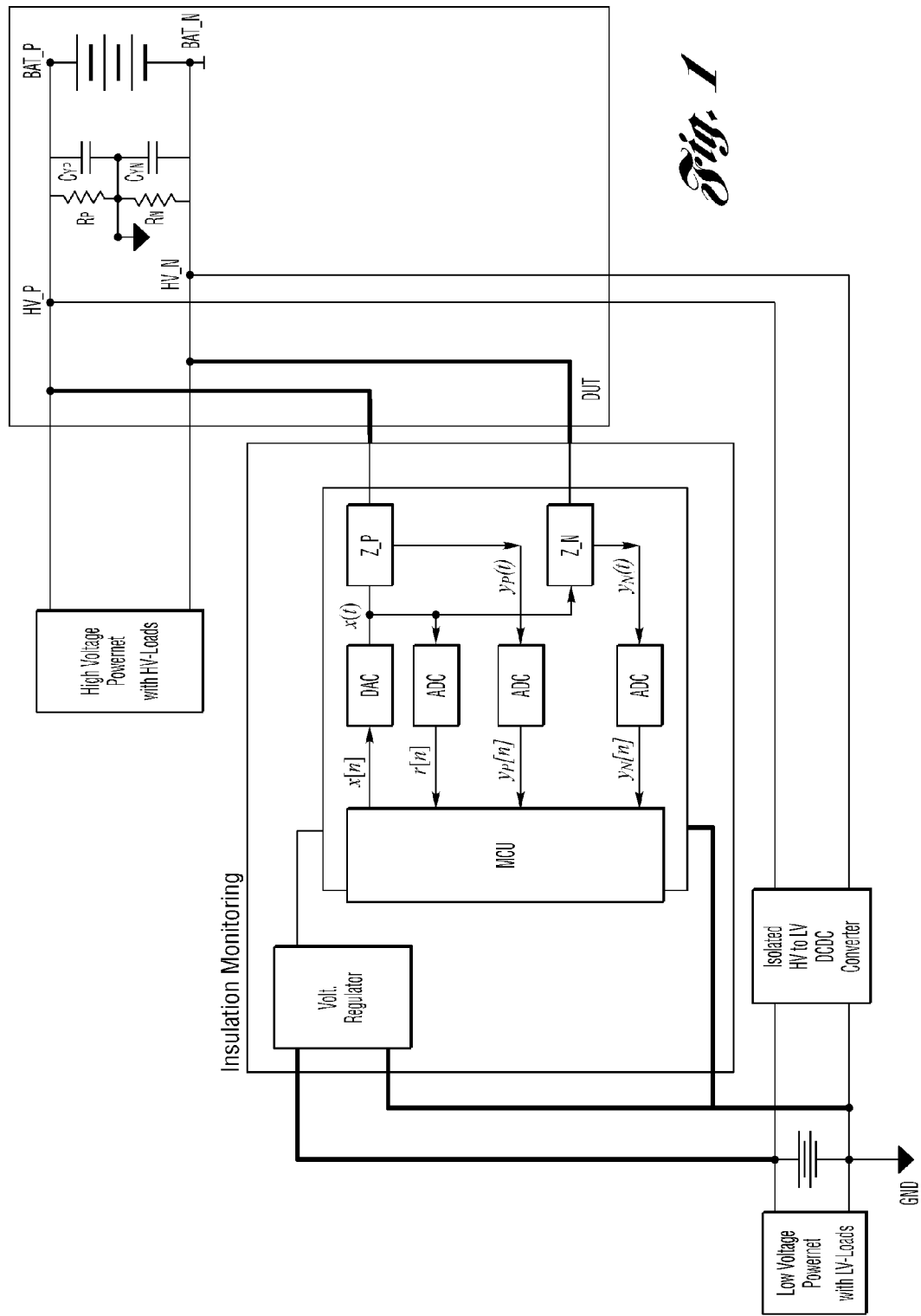
FIG. 1 illustrates a vehicle power system in accordance with one non-limiting aspect of the present invention.

FIG. 1 illustrates a vehicle power system in accordance with one non-limiting aspect of the present invention. The system may be configured as an electric DC circuit having a battery with two terminals: a positive terminal (BAT_P) and a negative terminal (BAT_N). The positive terminal may be connected to a high-voltage positive net (HV_P) while a negative terminal is connected, optionally via a current sensing shunt, to the high-voltage negative net (HV_N). A first node (HV_P) and a second node (HV_N) of the high-voltage power net may be connected to a DC/DC converter—facilitating an isolated DC to DC conversion between the high-voltage power net from a low-voltage power net. The low-voltage power net may include a low-voltage battery. The low-voltage and high-voltage power net may be configured to provide and/or facilitate powering one or more corresponding high-voltage and low-voltage loads. For exemplary and non-limiting purposes, the high-voltage power net may be associated with a voltage of greater than 200 VDC while the low-voltage power net may be associated with the voltage of 12-16 VDC or 24-28 VDC, as is commonly employed in electric or partially electric vehicles.

The low-voltage power net may be grounded to a vehicle chassis while the high-voltage power net is grounded to a floating ground, e.g., the negative terminal of the high-voltage battery. FIG. 1 illustrates an equivalent circuit diagram of the insulation impedance between the high-voltage positive net and the reference potential, usually the common vehicle ground (e.g., the vehicle chassis) may be characterized with an insulation resistance R_P in parallel with the decoupling capacitance CY_P. The insulation impedance between the high-voltage negative net and the reference may be characterized with an insulation resistance R_N in parallel with the decoupling capacitance CY_N. One non-limiting aspect of the present invention contemplates assessing this theoretical/equivalent circuit diagram of the insulation impedance (also commonly referred to as insulation resistance) in an effort to determine whether a sufficient insulation is provided between a high-voltage power net and the low-voltage power net/vehicle ground so as to facilitate avoiding conditions under which arcing or other electrical transmissions may occur between the high-voltage power net and the low-voltage power net and/or vehicle ground.

An insulating monitoring device may be connected to the high-voltage power net in accordance with one non-limiting aspect of the present invention in order to facilitate assessing insulation impedance and/or insulation resistance. The insulating monitoring device may be comprised of a voltage regulator and an insulating monitor. The voltage regulator may be used to regulate a voltage supply from the low-voltage power net for output to the insulating monitor. The insulating monitor may be configured to exchange signaling with a device under test (DUT), i.e., the high-voltage power net or some other device. A microcontroller unit (MCU) may be included and configured to facilitate generating an input signal in the digital domain x[n] and analyzing both the reference signal r [n] and the output signals $y_P[n]$ and $y_N[n]$ by means of a proposed DSP technique or other suitable processing technique.

A digital-to-analog converter (DAC) may be included to facilitate converting the digital signal x[n] into a corresponding analog signal x(t), which may then be communicated to the high-voltage power net over top of any active DC signal of the power net in order to subject the high-voltage power net to a test signal and/or set of testing conditions. The DAC may be assumed not to be ideal and hence have a response $h_{DAC}(t)$ and introduce some noise and distortion. A plurality of analog-to-digital converters (ADCs) may be included and configured to facilitate converting an analog signal x(t) and signals $y_P(t)$ and $y_N(t)$ into corresponding digital signals r [n] and $y_P[n]$ and $y_N[n]$. The ADC may be similarly assumed not to be ideal and hence have a response $h_{ADC}(t)$ and introduce some noise and distortion.

Figure 2:
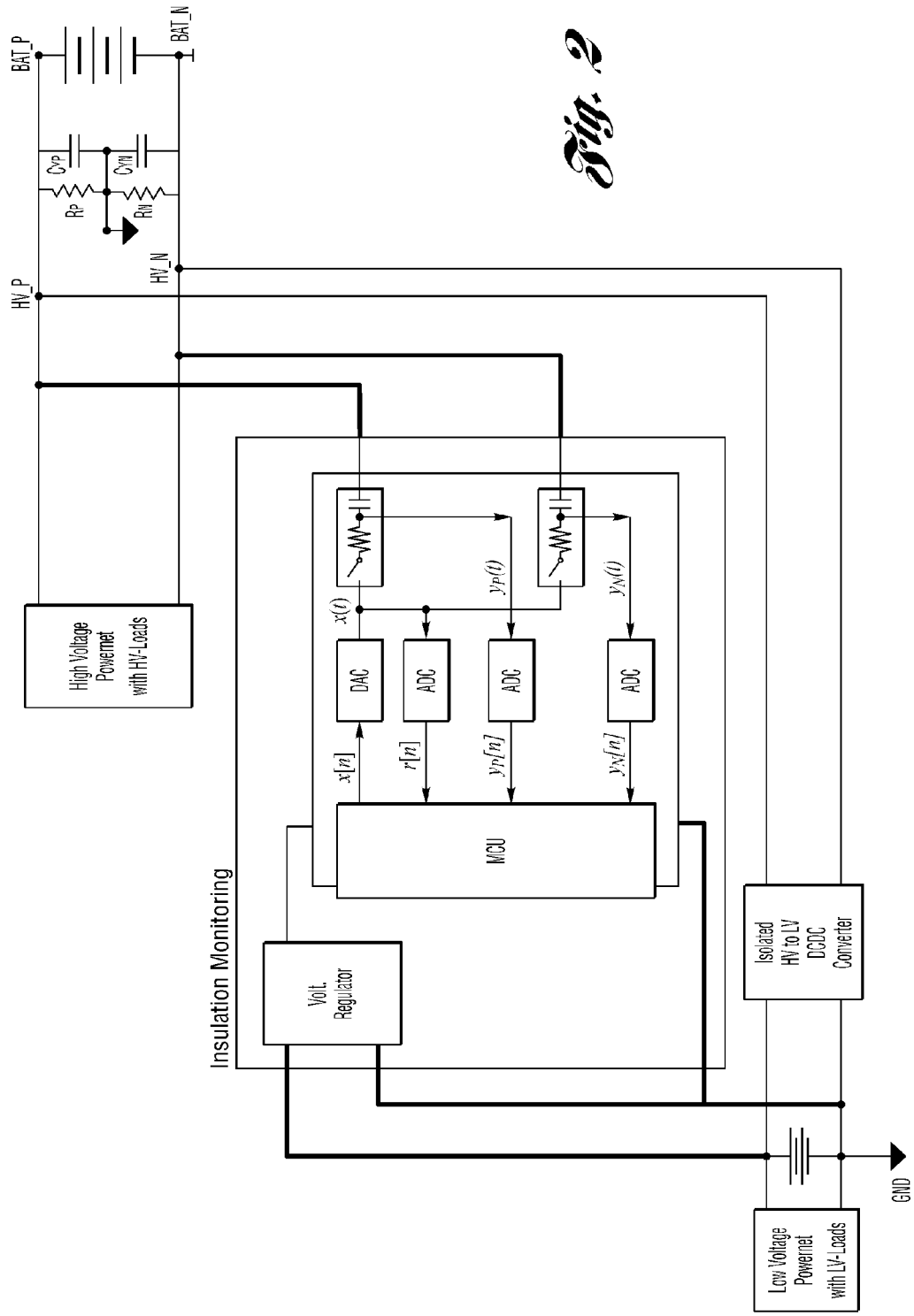
FIG. 2 illustrates a vehicle power system in accordance with one non-limiting aspect of the present invention.

A sensing/interface circuit may be used to inject the measurement analog signal (test signal) in each branch (or node) of the HV distribution system. It may be composed by sensing impedances connected to positive (HV_P) and negative nodes (HV_N) of the HV distribution system. The - sensing impedance Z_P (composed by a resistor RS_P and a capacitor CS_P connected in series—See FIG. 2) may be connected to the node HV_P, i.e. it may be connected to the impedance composed by the insulation resistance R_P in parallel with the decoupling capacitance CY_P. The - sensing impedance Z_N (composed by a resistor RS_N and a capacitor CS_N connected in series—See FIG. 2) may be connected to the node HV_N, i.e. it is connected to the impedance composed by the insulation resistance R_N in parallel with the decoupling capacitance CY_N. FIG. 2 illustrates an alternative insulation monitor as contemplated by one non-limiting aspect of the present invention. The alternative insulation monitor may include a switch actuatable between an opened and a closed position to control the rotation of the test signal to one or both of the high-voltage positive power net and high-voltage negative power net.

To measure the insulation resistance, the attenuation and time-shift introduced by the DUT at a given frequency may be calculated. It is proposed to generate a signal that is constituted by one or several subcarriers at the desired frequencies and do a frequency domain analysis of the output and reference signals. The proposed technique is not only capable of determining the insulation resistance with high accuracy but also to minimize the non-ideal effects of the DAC, ADCs and analog circuitry because calibration is inherently done by the proposed scheme. Hence no extra calibration is required. Note that the attenuation and time shift may be computed from the reference signal and the DUT output signal and both signals are affected equally by the DAC, ADC and analog filtering.

Given the following frequency responses: $H_{DAC}(w)$ for the DAC, $H_{CIR}(w)$ for the analog circuitry and $H_{ADC}(w)$ for the ADC. The overall frequency response is found to be $$H_T(w) = H_{DAC}(w) \cdot H_{ADC}(w) \cdot H_{CIR}(w).$$

The reference signal in the frequency domain, which is affected by the overall frequency response of the analog stage, can be expressed as $$R(w) = H_T(w) \cdot X(w),$$

where $X(w)$ is the generated signal in the frequency domain. Additionally, the DUT output signal in the frequency domain, which is also affected by the frequency response of the DUT, can be expressed as $$Y(w) = H_T(w) \cdot H_{DUT}(w) \cdot X(w).$$

Accordingly, the transfer function may be computed as $$H(w) = \frac{Y(w)}{R(w)}$$
$$= \frac{H_T(w) \cdot H_{DUT}(w) \cdot X(w)}{H_T(w) \cdot X(w)}$$
$$= H_{DUT}(w),$$

which may be considered as the frequency response of the high-voltage power net.

The description herein after assumes the input signal of the DUT is a single sinusoidal signal of frequency $f_o$, i.e. $x(t) = \sin(w_0 t)$, where $w_0 = 2\pi f_o$. However, the present invention is not necessarily limited to sinusoidal signals and fully contemplates the use of any analog and/or non-analog test signal. In the event $x(t)$ is let to be the input signal of the DUT, and one of the output signals (any of them) can be expressed as $y_i(t) = A \cdot x(t - \Delta t)$, where A is the gain (or attenuation) factor and $\Delta t$ the time-shift.

The linearity and time-shift properties of the Fourier transform (FT) may be used to analyze the measured signal in the frequency domain. Let $X(w)$ be defined as the frequency domain representation of the sinusoidal signal $x(t)$, which can be computed by means of the Fourier transform as $X(w) = TF\{x(t)\}$, then the frequency domain representation of $y_i(t)$ is $$Y_i(w) = TF\{y_i(t)\} = A \cdot X(w) \cdot e^{-j \cdot w_0 \cdot \Delta t}$$

To determine the attenuation and time-shift, one only needs to find the transfer function of the DUT as $$H(w) = \frac{Y_i(w)}{X(w)}$$
$$= A \cdot e^{-j \cdot w_0 \cdot \Delta t}$$

The attenuation is the absolute value of the transfer function $$|H(w)| = |A \cdot e^{-j \cdot w_0 \cdot \Delta t}| = |A| \cdot |e^{-j \cdot w_0 \cdot \Delta t}| = A \cdot 1 = A$$

and the time-shift can be obtained from the phase of the transfer function as $$\frac{\arg(H(w))}{-w_0} = \frac{\arg(A \cdot e^{-j \cdot w_0 \cdot \Delta t})}{-w_0}$$
$$= \frac{\arg(A) + \arg(e^{-j \cdot w_0 \cdot \Delta t})}{-w_0}$$
$$= \frac{0 - w_0 \cdot \Delta t}{-w_0}$$
$$= \Delta t$$

In a case where the input signal $x(t)$ can be constituted of several frequencies. In such case one should take into account that both the time-shift, $\Delta t_w$, and the attenuation, $A_w$, may depend on the frequency. This is noted by means of the subindex w.

Hence, in general we define the transfer function as $$H(w) = A_w \cdot e^{j \cdot \phi(w)}, \text{ where } \phi(w) = -w \cdot \Delta t_w$$

Thus, to determine the attenuation at a given frequency $w_0$ we only need to take the absolute value of the transfer function at that particular frequency $$|H(w_0)| = |A_{w_0} \cdot e^{j \cdot \phi(w_0)}| = |A_{w_0}| \cdot |e^{j \cdot \phi(w_0)}| = A_{w_0} \cdot 1 = A_{w_0}$$

Similarly, the time-shift at a given frequency $w_0$ can be obtained from the phase of the transfer function at that given frequency as $$\frac{\arg(H(w))}{-w_0} = \frac{\arg(A_{w_0} \cdot e^{j \cdot \phi(w_0)})}{-w_0}$$
$$= \frac{\arg(A_{w_0}) + \arg(e^{j \cdot \phi(w_0)})}{-w_0}$$
$$= \frac{0 + \phi(w_0)}{-w_0}$$
$$= \Delta t_{w_0}$$

One non-limiting aspect of the present invention contemplates implementing the assessment process with reliance on a test signal having a time domain signal that is constituted by N orthogonal subcarriers as follows:

$$x(t) = \sum_{k=-N/2}^{N/2-1} X_k \cdot e^{j 2\pi f_k t}, 0 \le t < T_s$$

where $X_k$ is the amplitude of the subcarrier at frequency $f_k = k/T_S$ and $T_S$ is the duration of the signal. The amplitude of each subcarrier shall satisfy:

$X_k$ takes the value 0 if the subcarrier is not used and $\{-0.5, 0.5\}$ if the subcarrier is used.

In order for the signal $x(t)$ to be real-valued, the subcarrier amplitudes must be Hermitian symmetric: $X_k = X^*_{-k}$, where the asterisk denotes complex conjugate.

As an example, a transmitted signal with duration of 5 seconds that is constituted of 2 subcarriers of amplitude 1 and −1 at frequencies 1 Hz and 3 Hz, respectively, in order for the subcarriers to be orthogonal, the subcarrier spacing is set to be 1/5=0.2 Hz.

To generate the 1 Hz signal of amplitude 1, $X_5=X_{-5}=1/2$ may be used and to generate the 3 Hz signal of amplitude −1 we use $X_{15}=X_{-15}=1/2$. The remaining subcarriers have zero amplitude. Then, $$x(t) = \underbrace{\frac{1}{2}e^{j2\pi t}}_{k=5} + \underbrace{\frac{1}{2}e^{-j2\pi t}}_{k=-5} + \underbrace{\frac{-1}{2}e^{j2\pi 3t}}_{k=15} + \underbrace{\frac{-1}{2}e^{-j2\pi 3t}}_{k=-15}$$
$$= \cos(2\pi t) + \cos(2\pi 3t)$$

It should be noted that the signal may be generated by the MCU, hence it may be beneficial to use the discrete (digital) formulation instead of the continuous (analog) one. The present invention contemplates using $x[n]$ to refer to the time domain signal $x(t)$ in the digital domain and $X_k$ to refer to the frequency domain signal in the digital domain. It can be shown that $x[n]$ can be obtained by taking the $N/N_s$-scaled inverse discrete Fourier Transform (IDFT) of the vector constituted by $\{X_k\}$: $[X_0, X_1, \ldots, X_{N-1}]$:

$$x[n] = \frac{1}{N_s}\sum_{k=0}^{N-1} X_k e^{j2\pi kn/N}, n = 0, 1, \ldots, N-1$$

where $N_s$ is the number of active subcarriers (i.e. with an amplitude different than zero) and N is the IDFT size. To reduce the requirements of the analog circuitry, the sampling frequency may be significantly larger than the maximum frequency, e.g. N may be significantly larger than the largest subcarrier index with amplitude different than zero.

In the digital formulation, k may be selected to be in the range $[0, N-1]$ instead of $$\left[-\frac{N}{2}, \frac{N}{2}-1\right]$$

as in the analog formulation. This means that in the digital domain the unnormalized frequency spectrum may be looked at in the range $[0, f_s)$ instead of $$\left[-\frac{f_s}{2}, f_s\right).$$

According to the sampling theorem, the digital spectrum in the range $$\left[\frac{f_s}{2}, f_s\right)$$

is exactly the same to that in the range $$\left[-\frac{f_s}{2}, 0\right).$$

Hence both ranges of the k index provide the same information. The reason for using the positive range is that computers do not operate with negative indices.

In the digital formulation, the Hermitian symmetry means that $X_k=X^*_{N-k}$.

Considering the previous example: a signal with a duration of 5 seconds that is constituted of 2 subcarriers of amplitude 1 and −1 at frequencies 1 Hz and 3 Hz, respectively. Again, in order for the subcarriers to be orthogonal, the subcarrier spacing is set to be 1/5=0.2 Hz. Assuming a sampling time of 1 ms, to generate the 5 seconds signal one needs N=5000. To generate the 1 Hz signal of amplitude 1 we use $X_5=X_{4995}=1/2$ and to generate the 3 Hz signal of amplitude −1 we use $X_{15}=X_{4985}=-1/2$. Remaining subcarriers have zero amplitude.

Figure 3:
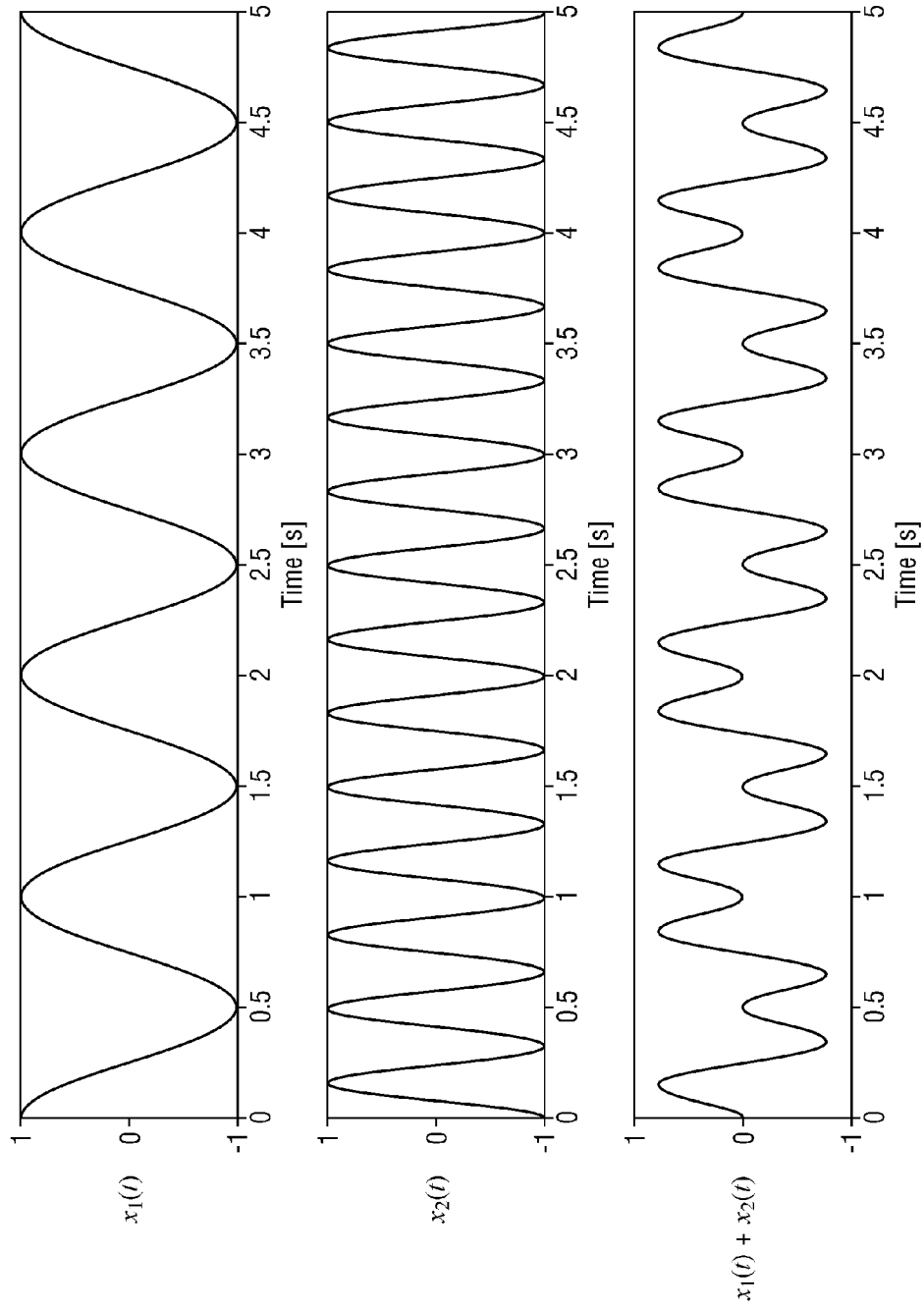
FIG. 3 illustrates test signals in accordance with one non-limiting aspect of the present invention.

The plot shown in FIG. 3 shows an example of the generated signal, including the two individual (and orthogonal) signals, $x_1(t)=\cos(2\pi t)$ and $x_2(t)=-\cos(2\pi 3t)$, and the final one, which is the addition of these two (orthogonal) signals.

Figure 4:
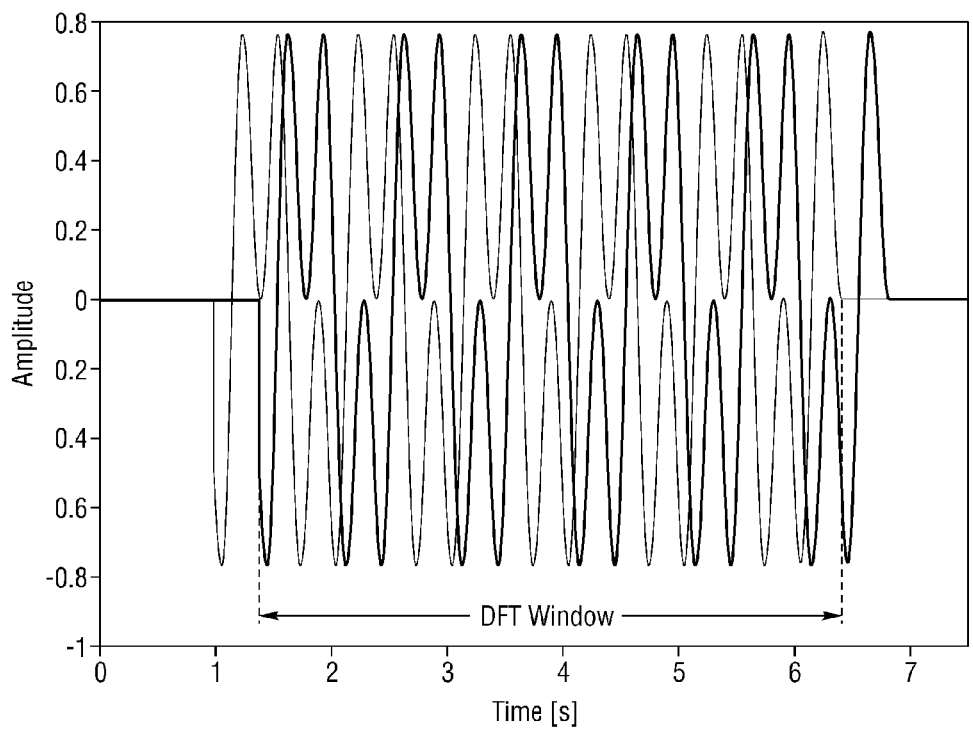
FIG. 4 illustrates a frequency response in accordance with one non-limiting aspect of the present invention.

Given the output signals $y_P[n]$ and $y_N[n]$ may be time-shifted with respect to the reference signal $r[n]$, to be able to process the signal in the whole DFT window size, a cyclic postfix may be added to the transmitted signal so that both signals are non-zero in this DFT window. See FIG. 4 as an example where the signal in blue is the generated signal, the signal in blue is the received signal showing a time shift with respect to the generated signal.

Figure 5:
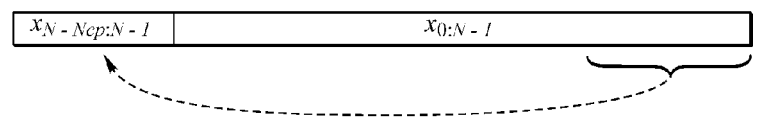
FIGS. 5-6 illustrate digital signal processing in accordance with one non-limiting aspect of the present invention.

As depicted in FIG. 5, the cyclic prefix insertion may be done by simply copying the last samples of the generated time domain signal to the beginning The length of the cyclic prefix, $N_{cp}$, May be chosen so that $N_{cp} \cdot T_s$ is larger than the maximum delay experienced by the output signal.

In detection, to reduce the requirements of the analog circuitry, the sampling frequency used is significantly larger than the maximum frequency.

Figure 6:
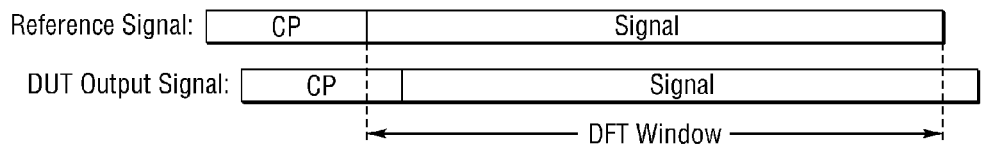

FIG. 6 depicts the reference signal and DUT output signal. For the insulation monitoring it may be only necessary to review the part of the signal that lies within the DFT window. In practice, this means that the first $N_{cp}$ samples acquired by the ADC after the start of transmission of the input signal $x[n]$ may need to be discarded.

Defining $r[n]$, $n \in [0, N-1]$ and $y_i[n]$, $n \in [0, N-1]$ as the reference signal and DUT output signals $i \in [N, P]$ within the DFT window, the attenuation and time-shift of $y_i[n]$ with respect to $r[n]$ may be computed as follows:
1. Convert the reference signal to the frequency domain by means of the $N_s/N$-scaled DFT:

$$1.\ R_k = \frac{N_s}{N}\sum_{n=0}^{N-1} r_n e^{-j2\pi kn/N}, k \in Q$$

2. where Q is the set of subcarrier indices with amplitude different than zero with values in the range $[0,N/2]$.
2. Convert the DUT output signal to the frequency domain by means of the $N_s/N$-scaled DFT:

$$3.\ Y_k = \frac{N_s}{N}\sum_{n=0}^{N-1} y_n e^{-j2\pi kn/N}, k \in Q$$

3. Compute the transfer function of the DUT at subcarrier k as:

$$4.\ H_k = \frac{Y_k}{X_k}, k \in Q$$

4. Compute the attenuation at subcarrier k, namely $A_k$, by taking the absolute value of the transfer function:
5. $A_k=|H_k|$, $k \in Q$ 5. Compute the time-shift at subcarrier k, namely $\Delta t_k$, from the phase of the transfer function as:

$$\Delta t_k = -\frac{T_s}{2\pi k} \cdot \arg(H_k), k \in Q$$

In the event the number of subcarriers is much smaller than the FFT size, to reduce the computational complexity, it may be beneficial, rather than taking the whole DFT of the reference and DUT output signals, to just compute the complex amplitude of the desired subcarriers. See steps 1 and 2.

Moreover, since the time domain signal r[n] and $y_i$[n] are real, it follows that the frequency domain signal are Hermitian symmetric. Hence it may be sufficient to compute the complex amplitudes of the subcarriers with an index in the range [0, N/2]. For example, given a signal with a duration of 5 seconds that is constituted of 2 subcarriers of amplitude 1 and −1 at frequencies 1 Hz and 3 Hz, respectively.

The generated signal has the following characteristics:
Subcarrier spacing: 0.2 Hz
DFT size: N=5000
1 Hz subcarrier amplitudes: $X_5 = X_{4995} = 1/2$
3 Hz subcarrier amplitudes: $X_{15} = X_{4985} = -1/2$
Other subcarrier amplitudes: $X_k = 0, \forall k \neq [5, 15, 4985, 4995]$ To compute the attenuation and time shift at 1 Hz and 3 Hz we would do as follows:

Compute the complex amplitude of the reference signal at the desired frequencies:

$$R_5 = \frac{1}{2500} \sum_{n=0}^{4999} r_n e^{-j10\pi n/5000}$$

$$R_{15} = \frac{1}{2500} \sum_{n=0}^{4999} r_n e^{-j30\pi n/5000}$$

Compute the complex amplitude of the DUT output signal at the desired frequencies:

$$Y_5 = \frac{1}{2500} \sum_{n=0}^{4999} y_n e^{-j10\pi n/5000}$$

$$Y_{15} = \frac{1}{2500} \sum_{n=0}^{4999} y_n e^{-j30\pi n/5000}$$

Compute the transfer function of the DUT at the desired frequencies:

$$H_5 = \frac{Y_5}{R_5}, H_{15} = \frac{Y_{15}}{R_{15}}$$

Compute the attenuation at the desired frequencies:

$$A_5 = |H_5|, A_{15} = |H_{15}|$$

Compute the time-shift at the desired frequencies:

$$\Delta t_5 = -\frac{\arg(H_5)}{10000\pi}, \Delta t_{15} = -\frac{\arg(H_{15})}{30000\pi}$$

Finally, the attenuation A(f) and the time-shift $\Delta t$(f) may be used to obtain the equivalent impedance. One method contemplated by the present invention to obtain the equivalent impedance may be based on calibrating the system with fixed values of CY_N and CY_P with accurately values of R_N and R_P (for instance 1 Mohm, 900 Kohm, 800 Kohm, . . . , 500 Kohm, . . . , 100 Kohm, 50 Kohm). The values for each DUT output signal of each subcarrrier is measured and stored in the system for comparison with measurements taken during actual operation. When a measurement is done, the result may be compared with the stored values, and depending on the result of the comparison, the value of the resistor can be assigned to a certain range (for instance between 900 Kohm and 800 Kohm). Since several measures are available (because of using several subcarriers) a unique and significant value is obtained (for instance by averaging or using majority voting or similar). If this significant value corresponds to certain ranges (for instance below 200 Kohm), an alarm may be activated to indicate an insufficient level of insulation with the high-voltage power net, i.e., a insulating resistance lower than a threshold desired for preferable operation. In this manner, a first frequency response of the high-voltage power net may be compared to a desired frequency response, i.e., insulation resistance, to assess whether as sufficient level of insulation is provided.

Optionally from these measurements, the complete equivalent impedance Z_T=R_T+j X_T of the circuit formed by Z_N, Z_P and R_N and CY_N and R_P, CY_P may be calculated. The values of Z_N, Z_P are known and the values of R_N and CY_N and R_P, CY_P are computed using the formulae for serial—parallel combination of impedances: ZS=Z1+Z2 and ZP=(Z1*Z2)/(Z1+Z2).

As supported above, one non-limiting aspect of the present invention contemplates a system and method to compute an insulation resistance of a non-grounded HV distribution system (typically used in electric or plug-in-hybrid electric vehicles) and a vehicle ground or chassis. In these vehicles, a HV battery may be used to deliver/take energy to/from e.g. a traction inverter, a charger, a DC-DC converter and other HV loads. The HV power net (HV_P and HV_N lines) wired between these vehicle's components may be a floating electrical distribution (i.e. not referred to ground or chassis). As it may be desirable for the described distribution to be completely shielded and the shield connected to ground (i.e. vehicle chassis), the present invention contemplates a system to check that the right level of isolation exists between HV_P and HV_N lines and the ground (i.e. the equivalent resistors between these lines and ground, characterized by Rp and Rn, are large enough to guarantee that the vehicle is compliant with the requested electrical and functional safety specifications). This may be helpful to facilitate complicating a lower bound (within a maximum error) of the insulation resistance based on digital signal processing (DSP) techniques.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method of monitoring insulation resistance between a high-voltage power net and a low-voltage power net, the high-voltage power net and the low-voltage power net being included within a vehicle, the low-voltage power net being grounded to a first ground and the high-voltage power net being grounded to a second ground, the second ground floating relative to the first ground, the method comprising:

generating a test signal in a digital format;
converting the test signal in the digital format into an analog test signal;
applying the analog test signal to the high-voltage power net;
converting the analog test signal applied to the high-voltage power net into a digital reference signal;
measuring an output frequency response of the high-voltage power net to the analog test signal applied to the high-voltage power net while the high-voltage power net is active; and
comparing the output frequency response to a frequency domain representation of the digital reference signal to determine whether a desired insulation resistance is provided between the high-voltage power net and the low-voltage power net.

2. The method of claim 1 wherein the test signal includes at least two subcarriers.

3. The method of claim 2 wherein each of the at least two subcarriers are orthogonal.

4. The method of claim 1 further comprising converting the output frequency response from an analog domain to a digital domain, and wherein the digital domain of the output frequency response is compared with the frequency domain representation of the digital reference signal to determine whether the desired insulation resistance is provided.

5. The method of claim 1 further comprising measuring the output frequency response while a high-voltage battery is one of charging and discharging over the high-voltage power net, the high-voltage power net being active when the battery is the one of charging and discharging.

6. The method of claim 1 further comprising determining the desired insulation resistance to be provided in the event the output frequency response differs from the frequency domain representation of the digital reference signal by no more than a first amount, else determining the desired insulation resistance to be absent.

7. The method of claim 1 wherein the second ground is connected to a chassis of the vehicle.

8. The method of claim 1 wherein comparing the output frequency response to the frequency domain representation of the digital reference signal includes adjusting the output frequency response to compensate for a time delay between the output frequency response and the frequency domain representation of the digital reference signal.

9. The method of claim 8 wherein adjusting the output frequency response includes moving an ending portion of the output frequency response to precede a beginning portion of the output frequency response, and thereafter, comparing the output frequency response to the frequency domain representation of the digital reference signal to determine whether the desired insulation resistance is provided.

10. A circuit operable to assess insulation resistance of a high-voltage power net included within a vehicle, the circuit comprising:
a controller operable to output a test signal in a digital format;
a digital-to-analog converter operable to convert the test signal in the digital format to an analog test signal;
a positive sensor and interface circuit operable to output the analog test signal to a positive bus of the high-voltage power net;
a negative sensor and interface circuit operable to output the analog test signal to a negative bus of the high-voltage power net;
an analog-to-digital converter operable to convert the analog test signal into a digital reference signal;
a positive analog-to-digital converter operable to convert a positive analog response of the positive bus to the test signal for output as a positive digital response to the controller;
a negative analog-to-digital converter operable to convert a negative analog response of the negative bus to the test signal for output as a negative digital response to the controller;
wherein the controller determines an output frequency response of the high-voltage power net to the test signal based on at least one of the positive digital response and the negative digital response; and
wherein the controller compares the output frequency response to a frequency domain representation of the digital reference signal to determine whether a desired insulation resistance is provided between the high-voltage power net and a chassis of the vehicle.

11. The circuit of claim 10 wherein the test signal includes at least two subcarriers.

12. The circuit of claim 11 wherein each of the at least two subcarriers are orthogonal.

* * * * *